United States Patent
Nishii et al.

(10) Patent No.: US 6,852,612 B2
(45) Date of Patent: Feb. 8, 2005

(54) SEMICONDUCTOR DEVICE AND METHOD FOR FABRICATING THE SAME

(75) Inventors: Katsunori Nishii, Osaka (JP); Yoshito Ikeda, Osaka (JP); Hiroyuki Masato, Osaka (JP); Kaoru Inoue, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/323,637

(22) Filed: Dec. 20, 2002

(65) Prior Publication Data

US 2003/0109088 A1 Jun. 12, 2003

Related U.S. Application Data

(62) Division of application No. 09/664,555, filed on Sep. 18, 2000, now Pat. No. 6,774,449.

(30) Foreign Application Priority Data

Sep. 16, 1999 (JP) .......................................... 11-262134

(51) Int. Cl.[7] .............................................. H01L 21/28
(52) U.S. Cl. ....................... 438/581; 438/580; 438/575; 438/570
(58) Field of Search ................................ 438/167, 172, 438/570, 573, 580, 581, 583, 575, 572

(56) References Cited

U.S. PATENT DOCUMENTS

| 5,705,830 A | * | 1/1998 | Siergiej et al. ................. 257/77 |
| 5,929,467 A | | 7/1999 | Kawai et al. |
| 6,100,174 A | * | 8/2000 | Takatani ..................... 438/605 |
| 6,239,490 B1 | * | 5/2001 | Yamada et al. ............. 257/745 |
| 6,281,526 B1 | | 8/2001 | Nitta et al. |
| 6,316,793 B1 | * | 11/2001 | Sheppard et al. ........... 257/103 |
| 6,399,413 B1 | * | 6/2002 | Krutsick ...................... 438/92 |

FOREIGN PATENT DOCUMENTS

| JP | 63-217662 A | 9/1988 |
| JP | 01-093173 A | 4/1989 |
| JP | 10-209177 A | 8/1998 |
| JP | 11-135770 A | 5/1999 |
| JP | 11-297713 A | 10/1999 |
| JP | 2000-208435 | 7/2000 |

OTHER PUBLICATIONS

Q.Z. Liu et al., "Thermally stable PtSi Schotky contact on n–GaN", Appl. Phys. Lett. 70 (10), Mar. 10, 1997, pp. 1275–1277.

Q.Z. Liu et al., "Ni an Ni silicide Schotky contacts on N–GaN", J. of Appl. Phys. 84 (2) Jul. 15, 1998, pp. 881–886.

H.S. Venugopalan et al., "interfacial reactions between nickel thin films and GaN", J. of Appl. Phys. 82 (2), Jul. 15, 997, pp. 650–654.

Notice of reasons of rejection (Dated May 21, 2002).

* cited by examiner

*Primary Examiner*—Amir Zarabian
*Assistant Examiner*—Christy Novacek
(74) *Attorney, Agent, or Firm*—Donald R. Studebaker; Nixon Peabody, LLP

(57) ABSTRACT

The semiconductor device of the present invention includes: a gallium nitride (GaN) compound semiconductor layer; and a Schottky electrode formed on the GaN compound semiconductor layer, wherein the Schottky electrode contains silicon.

4 Claims, 19 Drawing Sheets

SEMICONDUCTOR DEVICE AND METHOD FOR FABRICATING THE SAME

This application is a Divisional of Ser. No. 09/664,555 filed Sep. 18, 2000, now U.S. Pat. No. 6,774,449.

BACKGROUND OF THE INVENTION

The present invention relates to a semiconductor device including a layer of a gallium nitride (GaN) compound semiconductor generally represented by $In_xAl_yGa_{1-x-y}N$ ($0 \leq X<1$, $0 \leq Y<1$, $0 \leq X+Y<1$) (hereinafter, compound semiconductors of this group are collectively called as "GaN compound semiconductors") and a method for fabricating such a semiconductor device. More particularly, the present invention relates to a Schottky electrode formed in contact with a GaN compound semiconductor layer and a method for forming such a Schottky electrode.

GaN compound semiconductors such as GaN, AlGaN, InGaN, and InAlGaN are direct transition semiconductors having a band gap varying in the range from 1.95 eV to 6 eV. These semiconductors are therefore expected as promising materials for light emitting devices such as laser diodes. GaN is also expected as a promising material for a high-frequency power device since it possesses high dielectric breakdown electric field intensity, high thermal conductivity, and a high electron saturation rate. In particular, an AlGaN/GaN hetero-junction structure has an electric field intensity as high as $1\times10^5$ V/cm and an electron velocity twice or more as high as that of GaAs. This structure is therefore expected to contribute to realization of high-frequency operation in combination with miniaturization of the device.

GaN compound semiconductors exhibit n-type characteristics when they are doped with an n-type dopant such as Si and Ge. Therefore, it has been attempted to apply the GaN compound semiconductors to field effect transistors (FETs). In general, a metal semiconductor field effect transistor (MESFET) using a Schottky metal as a Schottky electrode has been studied. Schottky characteristics greatly influence the drain breakdown voltage and the current characteristics of a FET obtained when the gate voltage applied is positive. Conventionally, therefore, in consideration of the Schottky characteristics, metal such as palladium and platinum is generally used as the Schottky electrode for a GaN compound semiconductor.

However, although the metal such as palladium and platinum is good in barrier height and ideal factor n value as indicators of the Schottky characteristics, it is poor in adhesion to a GaN compound semiconductor that is to form a Schottky junction together with the metal. As a result, the electrode is disadvantageously peeled off or lifts during fabrication process. Therefore, for a high-frequency device where a fine gate having a gate length of a sub-half micron is indispensable, in particular, processing of such a Schottky metal will be further difficult.

SUMMARY OF THE INVENTION

An object of the present invention is providing a semiconductor device including a Schottky electrode excellent in adhesion to a GaN compound semiconductor layer. Another object of the present invention is providing a method for fabricating such a semiconductor device.

A semiconductor device of the present invention includes: a gallium nitride compound semiconductor layer; and a Schottky electrode formed on the gallium nitride compound semiconductor layer, wherein the Schottky electrode contains silicon.

In an embodiment, the weight content of the silicon in the Schottky electrode is in a range between more than 0% and 20% or less.

In another embodiment, the weight content of the silicon is in a range between 3% and 20%, inclusive.

In still another embodiment, the Schottky electrode has been heat-treated at a temperature in a range between 400° C. and 600° C.

Another semiconductor device of the present invention includes: a gallium nitride compound semiconductor layer; and a Schottky electrode formed on the gallium nitride compound semiconductor layer, wherein the Schottky electrode contains nickel.

In an embodiment, the weight content of the nickel in the Schottky electrode is in a range between more than 0% and 20% or less.

Still another semiconductor device of the present invention includes: a gallium nitride compound semiconductor layer; and a Schottky electrode formed on the gallium nitride compound semiconductor layer, wherein the Schottky electrode has a multilayer structure, and the bottom layer of the multilayer structure in contact with the gallium nitride compound semiconductor layer is made of silicon.

Still another semiconductor device of the present invention includes: a gallium nitride compound semiconductor layer; and a Schottky electrode formed on the gallium nitride compound semiconductor layer, wherein the Schottky electrode has a multilayer structure, and the bottom layer of the multilayer structure in contact with the gallium nitride compound semiconductor layer is made of nickel.

In an embodiment, the thickness of the bottom layer is in a range between more than 0 nm and 20 nm or less.

In another embodiment, the Schottky electrode contains palladium or platinum.

In still another embodiment, a metal having a resistivity lower than the Schottky electrode is formed in contact with the Schottky electrode.

A method for fabricating a semiconductor device of the present invention includes the steps of: preparing a gallium nitride compound semiconductor layer; forming a Schottky electrode containing silicon or nickel on the gallium nitride compound semiconductor layer; and after the step of forming a Schottky electrode, heat-treating the Schottky electrode at a temperature in a range between 400° C. and 600° C.

Another method for fabricating a semiconductor device of the present invention includes the steps of: preparing a gallium nitride compound semiconductor layer; forming a Schottky electrode having a multilayer structure the bottom layer of which is made of silicon or nickel; and after the step of forming a Schottky electrode, heat-treating the Schottky electrode at a temperature in a range between 400° C. and 600° C.

In an embodiment, the step of heat-treating the Schottky electrode is performed at a temperature in a range between 500° C. and 600° C.

DESCRIPTION OF THE PREFERRED EMBODIMENTS

Figure 1:
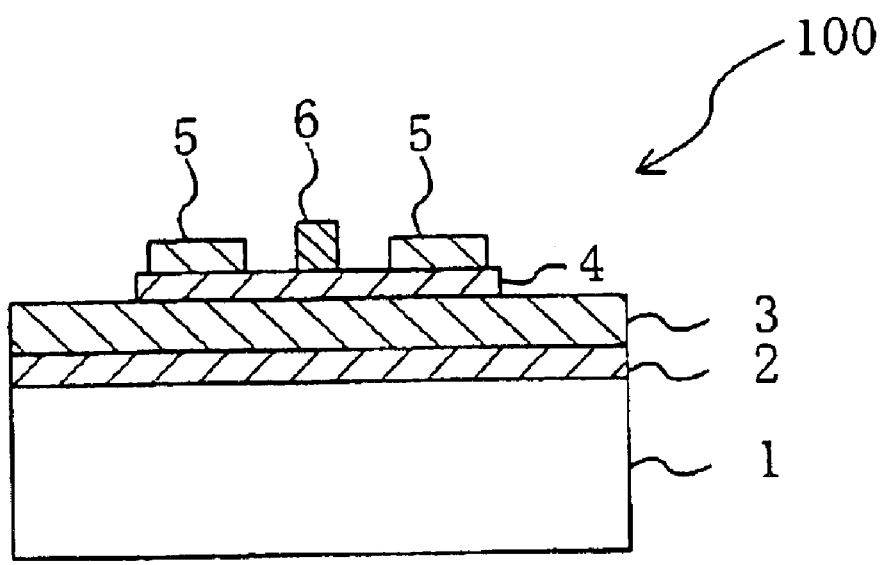
FIG. 1 is a cross-sectional view schematically illustrating a semiconductor device (FET) of EMBODIMENT 1 of the present invention.

The present inventors have found that the adhesion of a Schottky electrode to a GaN compound semiconductor layer markedly improves by adding silicon to the Schottky electrode. The present invention has been devised based on this finding.

Hereinafter, preferred embodiments of the present invention will be described with reference to the accompanying drawings. In the drawings, components having substantially the same functions are denoted by the same reference numerals for simplification of the description. It should be noted that the present invention is not restricted to the following embodiments.

Embodiment 1

A semiconductor device of EMBODIMENT 1 of the present invention will be described with reference to FIGS. 1 and 2A through 2C.

FIG. 1 schematically illustrates a cross section of a semiconductor device 100 of this embodiment. The semiconductor device 100 is a field effect transistor (FET) including a buffer layer 2 made of AlN (thickness: about 40 nm), a non-doped GaN layer 3 (thickness: about 2 $\mu$m), and an n-type GaN active layer 4 (thickness: about 100 nm) doped with Si at a carrier density of $7 \times 10^{17}$ cm$^{-3}$ sequentially formed in this order on a sapphire substrate 1. Two ohmic electrodes 5 are formed on the n-type GaN active layer 4, and a Schottky electrode 6 made of PdSi is formed between the ohmic electrodes 5.

Figure 2A:
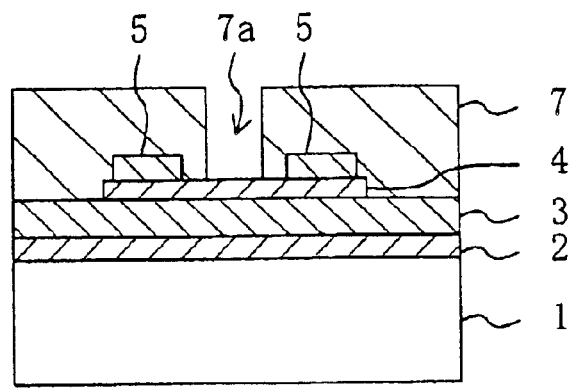
FIGS. 2A through 2C are cross-sectional views illustrating the steps of fabrication of the semiconductor device of EMBODIMENT 1.
Figure 2B:
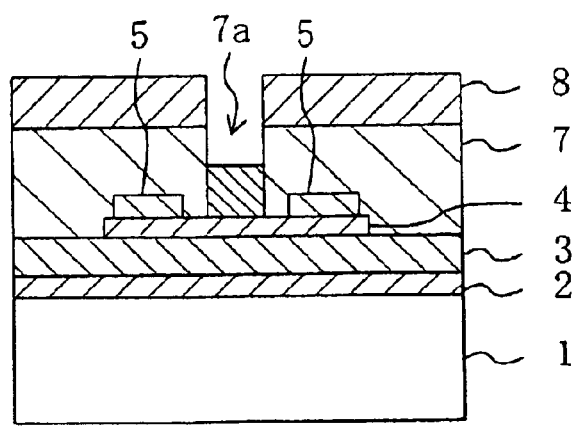
Figure 2C:
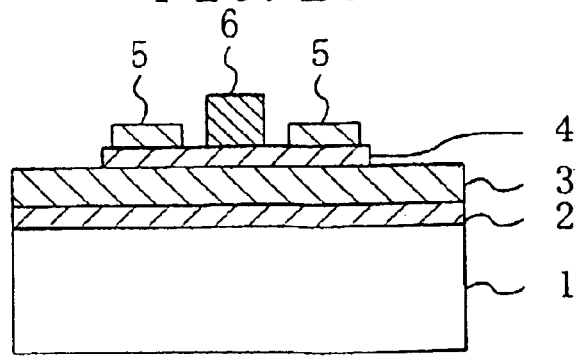

A method for fabricating the semiconductor device 100 of this embodiment will be described. FIGS. 2A through 2C illustrate steps for fabrication of the semiconductor device 100.

Referring to FIG. 2A, first, the sapphire substrate 1 is prepared. On the sapphire substrate 1, formed sequentially are the buffer layer 2, the non-doped GaN layer 3, the Si-doped n-type GaN active layer 4 at a carrier density of $7 \times 10^{17}$ cm$^{-3}$, and the ohmic electrodes 5. Thereafter, the n-type GaN active layer 4 is covered with a photoresist pattern 7 having an opening 7a defining a region for formation of the Schottky electrode 6.

Referring to FIG. 2B, a Schottky metal 8 is deposited over the resultant substrate by vacuum evaporation or the like, whereby the opening 7a is filled with the Schottky metal 8.

Finally, referring to FIG. 2C, the photoresist pattern 7, as well as the Schottky metal 8 formed on the photoresist pattern 7, are removed by ultrasonic treatment using a photoresist removal solution or by high-pressure spraying, leaving the Schottky metal 8 formed in the opening 7a unremoved. Thus, the Schottky electrode 6 is obtained. In the above lift-off procedures for forming the Schottky electrode 6, the adhesion of the Schottky metal 8 to the underlying n-type GaN active layer 4 is important.

If the Schottky electrode is made of Pd (that is, the Schottky metal 8 is Pd) as in the conventional case, Pd is poor in adhesion to the n-type GaN active layer 4. Therefore, the resultant Schottky electrode will be easily peeled off during the ultrasonic treatment or the high-pressure spraying in the lift-off procedures. This trouble of peeling of the electrode may be solved if the ultrasonic treatment or the high-pressure spraying is omitted or performed with a reduced power. In this case, however, the metal deposited on the photoresist pattern 7 that is to be removed tends to be left unremoved, resulting in reducing the processing yield. In particular, the influence of this adhesion of the Schottky electrode on the processing yield is greater as the gate length of the semiconductor device is smaller.

Unlike the conventional technique, the present invention uses PdSi, where Si is added to Pd, as the Schottky metal 8. The present inventors have confirmed that using PdSi as the Schottky metal 8 no trouble of peeling of the electrode occurs at all during the ultrasonic treatment or the high-pressure spraying in the lift-off procedures and thus the Schottky electrode 6 can be formed with a processing yield of nearly 100%.

Figure 3:
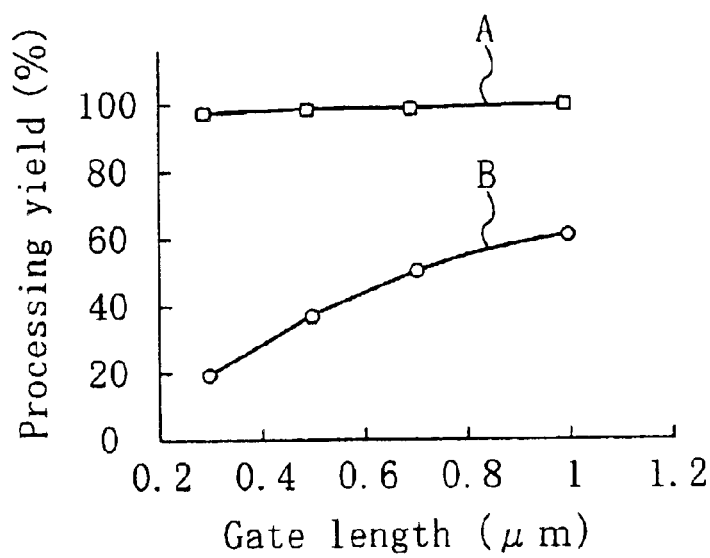
FIG. 3 is a graph showing the relationship between the gate length of the semiconductor device of EMBODIMENT 1 and the processing yield in a lift-off technique.

FIG. 3 is a graph showing the relationship between the gate length of the FET and the processing yield in the lift-off procedures. A curve A in the graph represents the case where the Schottky electrode 6 is made of PdSi while a curve B represents the case where the Schottky electrode 6 is made of Pd.

As is apparent from FIG. 3, in the case of using Pd (curve B), the processing yield is only 60% even when the gate length is as long as 1 $\mu$m, and decreases as the gate length is smaller, until the processing yield is as low as 20% when the gate length is 0.3 $\mu$cm. On the contrary, in the case of using PdSi (curve A), the processing yield of nearly 100% is obtained irrespective of the gate length. In other words, it has been confirmed that a processing yield of nearly 100% is obtainable even when the gate length is 0.3 $\mu$m. From the above results, it is found that the Schottky electrode made of PdSi is excellent in the adhesion to the n-type GaN active layer 4.

Figure 4:
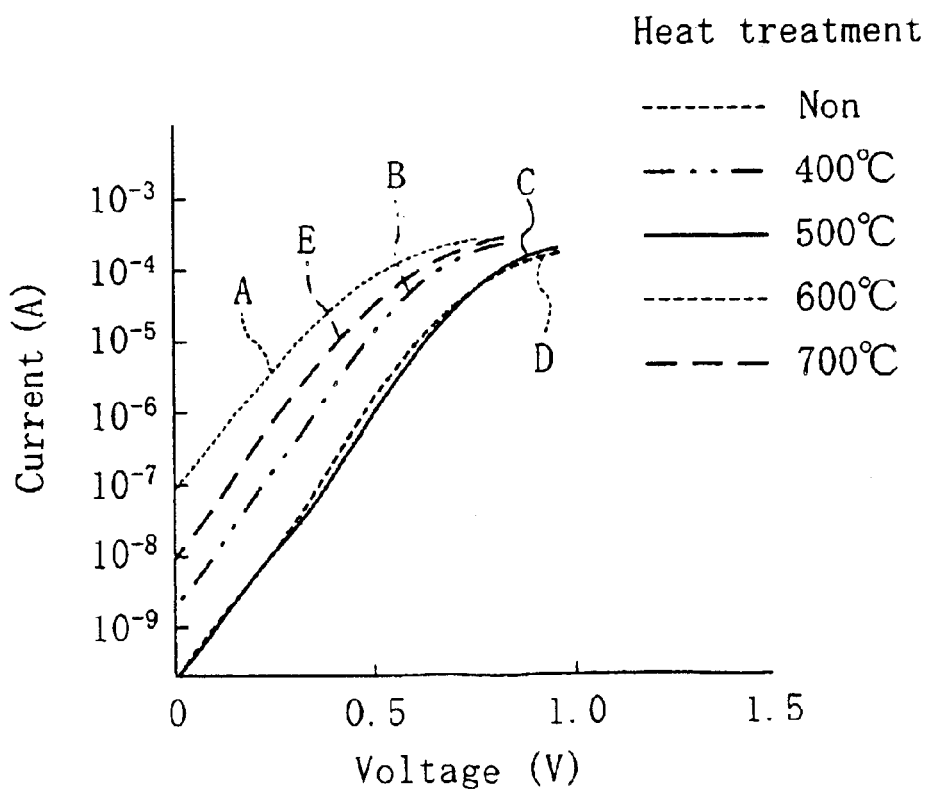
FIG. 4 is a graph showing the current-voltage characteristics of the semiconductor device of EMBODIMENT 1.

FIG. 4 is a graph showing the forward current-voltage (I-V) characteristics of a Schottky diode having an area of 100 $\mu m^2$ fabricated under the same conditions as those for the fabrication of the FET 100 shown in FIG. 1. Curves A through E represent the I-V characteristics in the cases of no heat treatment performed, heat treatment performed at 400° C., 500° C., 600° C., and 700° C., respectively.

Figure 5A:
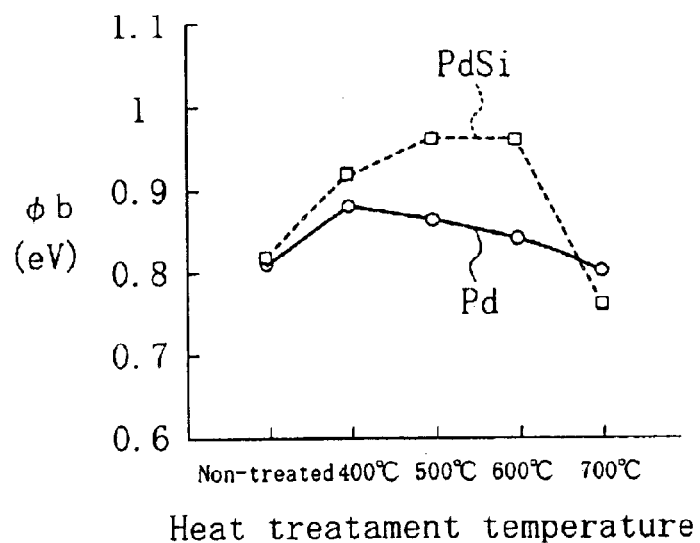
FIGS. 5A and 5B are graphs showing the barrier height and the ideal factor n value, respectively, with respect to the heat treatment temperature.
Figure 5B:
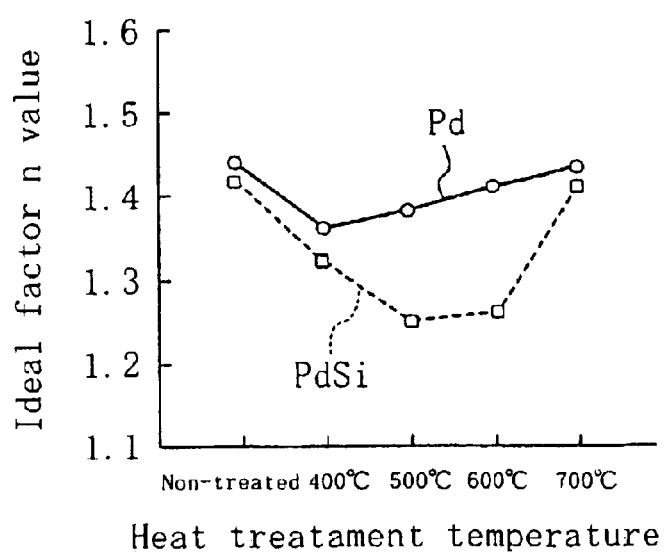

FIGS. 5A and 5B show the barrier height ($\phi_b$) and the ideal factor n value, respectively, calculated from the I-V characteristics shown in FIG. 4. Each heat treatment was performed in an argon gas atmosphere for five minutes. FIGS. 5A and 5B also show the results of the conventional Schottky electrode made of Pd formed under the same conditions as those in this embodiment.

As is found from FIGS. 5A and 5B, when no heat treatment is performed, the barrier height and the ideal factor n value are 0.82 eV and 1.42, respectively, in the case of using PdSi, while they are 0.81 eV and 1.44 in the case of using Pd. This indicates that the Schottky characteristics are roughly the same between the two cases when no heat treatment is performed.

When heat treatment is performed at 400° C., the barrier height and the ideal factor n value are 0.92 eV and 1.32, respectively, in the case of using PdSi, while they are 0.88 eV and 1.36 in the case of using Pd. This indicates that the Schottky characteristics have improved from those obtained when no heat treatment is performed, in both cases and that the improvement is greater in the case of using PdSi.

When heat treatment is performed at 500° C., the barrier height and the ideal factor n value are 0.96 eV and 1.25, respectively, in the case of using PdSi, showing improvement. On the contrary, they are 0.86 eV and 1.38 in the case of using Pd, showing degradation.

When heat treatment is performed at 600° C., the barrier height and the ideal factor n value are 0.96 eV and 1.26, respectively, in the case of using PdSi, showing substantially no change from those at 500° C. On the contrary, they are 0.84 eV and 1.41 in the case of using Pd, showing further degradation.

When the temperature of heat treatment is raised to 700° C., the barrier height and the ideal factor n value degrade even for the Schottky electrode 6 made of PdSi.

From the above results, it is found that the Schottky characteristics are improved by using PdSi, in place of the conventional Pd, for the Schottky electrode 6 and heat-treating the Schottky electrode 6 at a temperature in the range of 400 to 600° C., preferably in the range of 500 to 600° C.

Figure 6A:
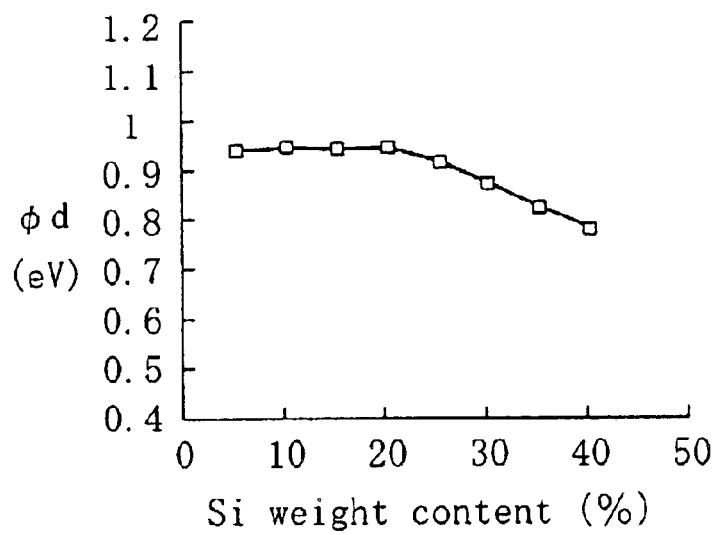
FIGS. 6A and 6B are graphs showing the barrier height and the ideal factor n value, respectively, with respect to the Si weight content (%).
Figure 6B:
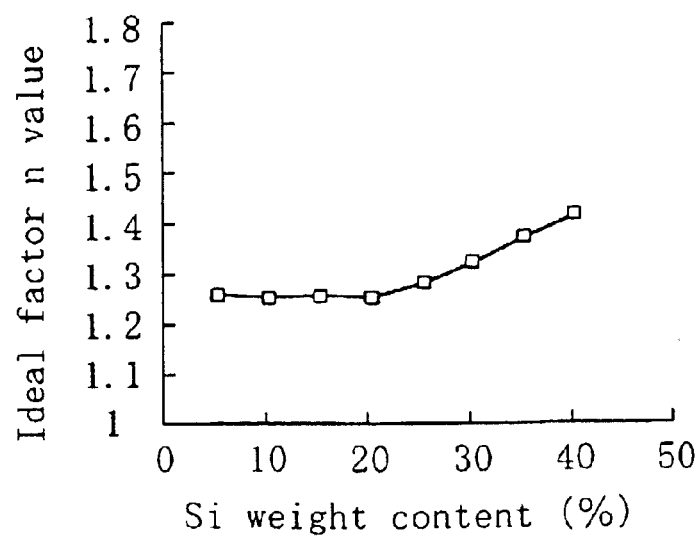

FIG. 6A shows the relationship between the Si weight content in the PdSi alloy constituting the Schottky electrode 6 and the barrier height as one of the Schottky characteristics, and FIG. 6B shows the relationship between the Si weight content and the ideal factor n value. In this embodiment, the evaluation was made by preparing the Schottky electrodes 6 having Si weight contents of 3%, 10%, 15%, 20%, 25%, 30%, 35%, and 40%. Such Schottky electrodes had an area of 100 $\mu m^2$ and, after formation, were subjected to five-minute heat treatment at 500° C.

As is observed from FIGS. 6A and 6B, both the barrier height and the ideal factor n value are roughly stable when the Si weight content is 20% or less. When the Si weight content exceeds 25%, the barrier height gradually decreases. This is presumably because, while Pd inherently has a high work function for a GaN compound semiconductor, Si has a work function lower than Pd, and as the content of Si in PdSi increases Si starts exhibiting its nature. In consideration of the above, in order to obtain a Schottky electrode having good Schottky characteristics, the Si weight content is desirably in the range between more than 0% (e.g., 3% or more) and 20% or less.

Figure 7:
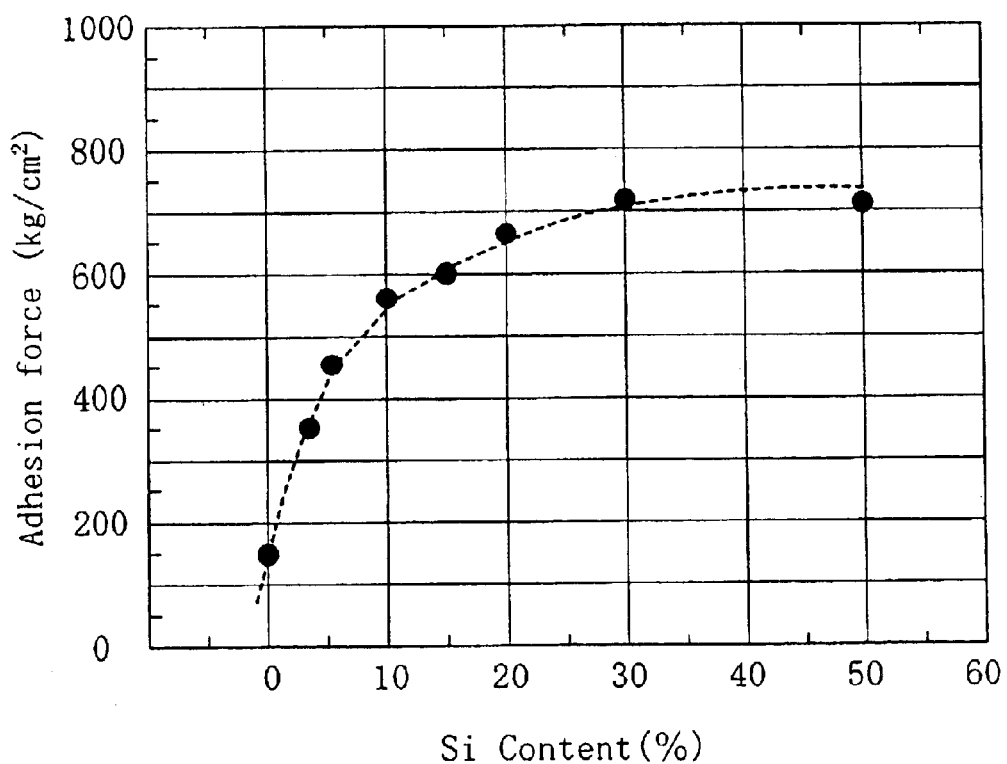
FIG. 7 is a graph showing the relationship between the Si weight content (%) and the adhesion force.

FIG. 7 shows the relationship between the Si weight content in the PdSi alloy constituting the Schottky electrode 6 and the adhesion force of the PdSi alloy to a GaN substrate. As is observed from this graph, the adhesion force, which was about 150 kg/cm² (about 15000 kPa) when the Si weight content was 0% (0 wt. %), increased to about 350 kg/cm² (about 35000 kPa) when the Si weight content was 3 wt. %, that is, increased double or more that when it was 0 wt. %. The adhesion force further increased to about 600 kg/cm² (about 60000 kPa) or more when the Si weight content was 15 wt. % or more, and about 700 kg/cm² (about 70000 kPa) when the Si weight content was 30 wt. % or more. As for the adhesion force, no decrease was observed as the Si content increased. This is due to the fact that the adhesion of the PdSi alloy is improved by the existence of Si.

Figure 8A:
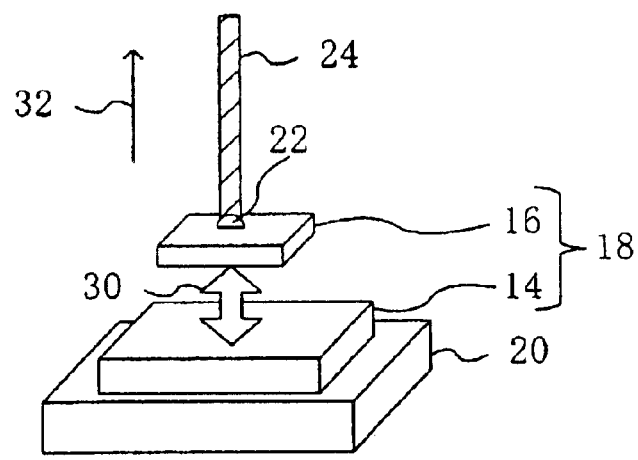
FIGS. 8A and 8B are views used for describing an adhesion evaluation method.
Figure 8B:
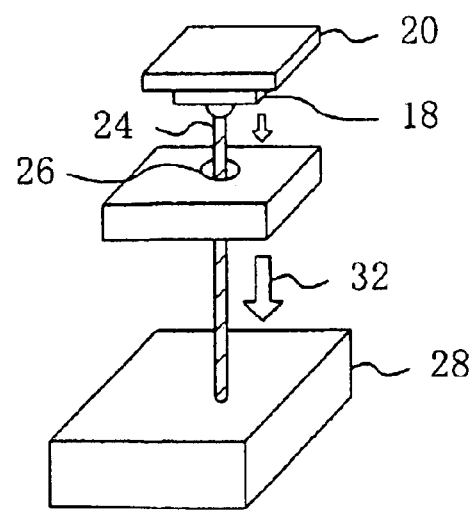

The adhesion force of the PdSi alloy to the GaN substrate was measured based on the Sebastian measurement principle. Specifically, the adhesion force was measured using a Sebastian adhesion evaluation apparatus as shown in FIGS. 8A and 8B. FIG. 8A illustrates the state where a PdSi alloy 16 and a GaN substrate 14 together constituting a layered sample 18 are detached from each other as shown by the arrow 30 due to application of a tension to the sample 18. FIG. 8B schematically illustrates the main portion of the Sebastian apparatus. The measurement of the adhesion force is performed in the following manner.

First, the sample 18 composed of the PdSi alloy 16 and the GaN substrate 14 bonded to each other is secured to a support plate 20. A stud 24 is then fixed on the surface of the sample 18 (the PdSi alloy 16) with a resin 22, and the stud 24 is fitted through a through hole 26 to be fixed on a tension application measurement base 28, so that the sample 18 is secured with respect to the tension application measurement base 28.

With the sample 18 placed as described above, tension is applied in the direction shown by the arrow 32. The value of the tension read when the sample 18 is peeled off is recorded as the peel strength (tensile strength). Using this peel strength, the adhesion force of the PdSi alloy to the GaN substrate is evaluated.

Although PdSi is used in this embodiment, the same results are also obtained when an alloy of Pd and nickel (Ni) (PdNi) is used.

Figure 9A:
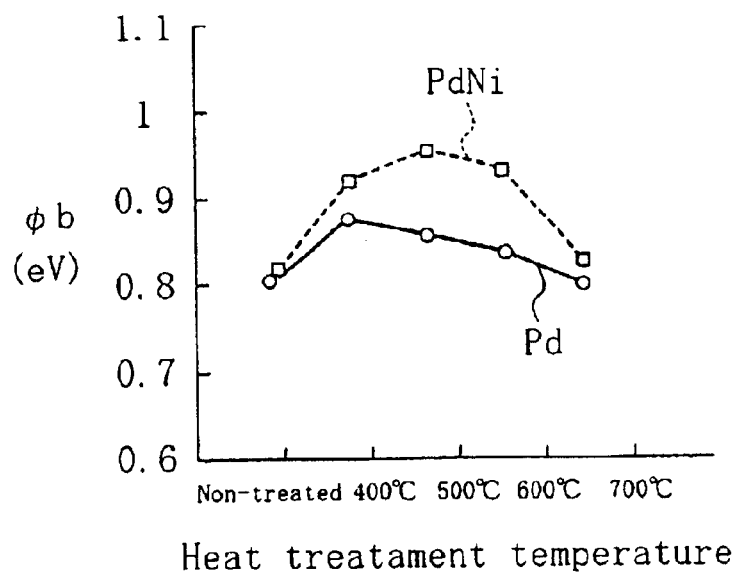
FIGS. 9A and 9B are graphs showing the barrier height and the ideal factor n value, respectively, with respect to the heat treatment temperature.
Figure 9B:
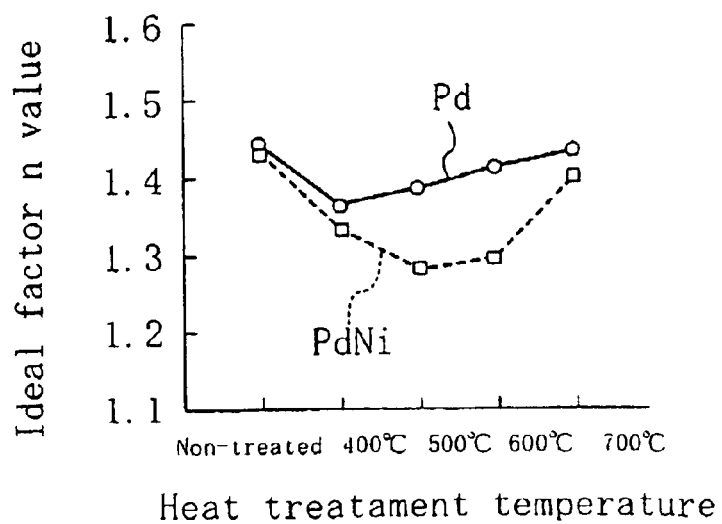

FIG. 9A shows the relationship between the barrier height and the heat treatment temperature, and FIG. 9B shows the relationship between the ideal factor n value and the heat treatment temperature, both in the cases of using Pd and PdNi for the Schottky electrode 6. As is apparent from comparison with the graphs of FIGS. 5A and 5B, the curves in FIGS. 9A and 9B are roughly the same as those in the case of using PdSi shown in FIGS. 5A and 5B, respectively, although actual values of the barrier height and the ideal factor n value for the respective heat treatment temperatures are slightly different from each other. These differences in values are within allowable measurement errors. Thus, it is found that PdNi also provides a good Schottky electrode 6 for the GaN compound semiconductor. The adhesion of PdNi was also evaluated and found that this material exhibited good adhesion with little causing processing failure such as peeling.

Platinum (Pt) is also a material often used as the Schottky electrode in combination with the GaN compound semiconductor. As in the case of Pd, Pt is poor in adhesion to GaN. Therefore, when the Schottky electrode 6 is formed using Pt by the lift-off technique, the processing yield is significantly low. In order to solve this problem, use of an alloy of Pt with Si or Ni was examined as in the case of Pd.

Figure 10A:
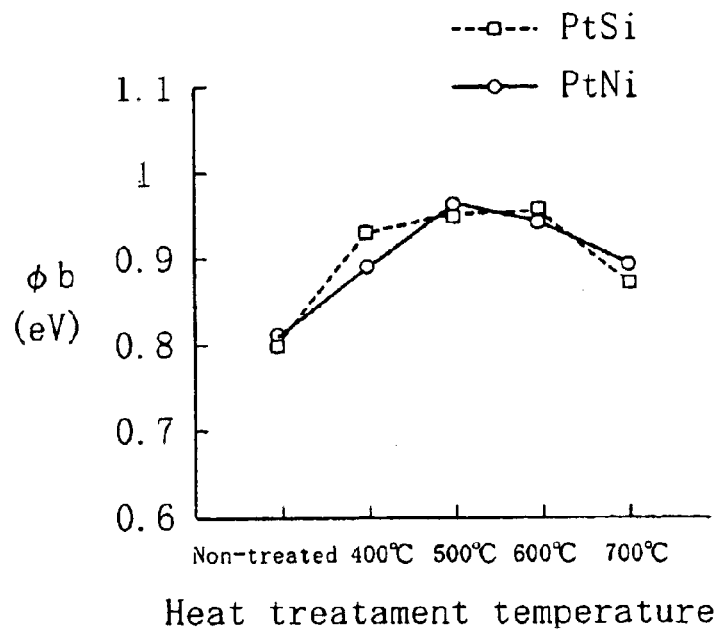
FIGS. 10A and 10B are graphs showing the barrier height and the ideal factor n value, respectively, with respect to the heat treatment temperature.
Figure 10B:
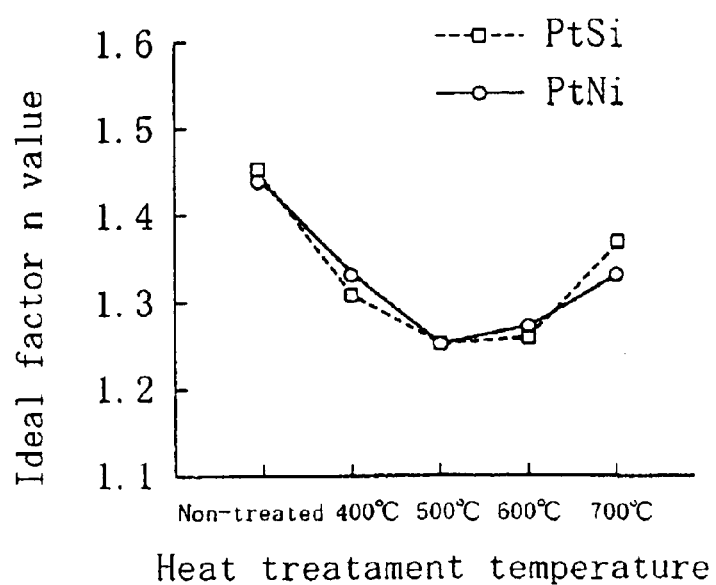

FIG. 10A shows the relationship between the barrier height and the heat treatment temperature for the Schottky electrodes 6 made of PtSi and PtNi, and FIG. 10B shows the relationship between the ideal factor n value and the heat treatment temperature. In this case, also, the barrier height and the ideal factor n value are improved by the heat treatment at a temperature in the range of 400 to 600° C., preferably in the range of 500 to 600° C. The adhesion of the Schottky electrode 6 improves by using the alloy of Pt with Si or Ni as in the case of Pd, and therefore no problem arises on processability. In view of the above results, it is found that use of PtSi and PtNi as the Schottky electrode 6 is also effective. It should be noted that the other elements of the platinum group and gold (Au) may be used in place of Pd and Pt used in this embodiment. This also applies to the subsequent embodiments.

When the FET including a GaN compound semiconductor is to be applied to a high-frequency device, reduction in gate resistance is important. However, the alloys such as PdSi, PdNi, PtSi, and PtNi are higher in resistivity than their original metals, and Pd and Pt are higher in resistivity than gold (Au) and aluminum (Al). Therefore, when these alloys are used as a gate metal, reduction in resistance is indispensably required.

Figure 11:
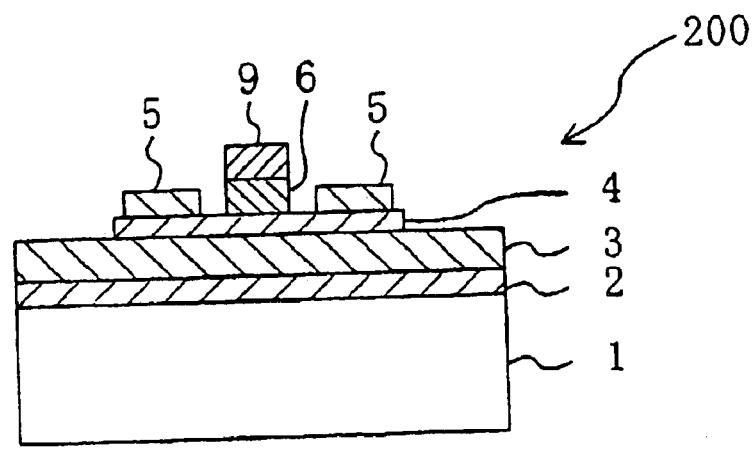
FIG. 11 is a cross-sectional view schematically illustrating another semiconductor device (FET) of EMBODIMENT 1.

In order to overcome the above problem, a semiconductor device 200 shown in FIG. 11 is proposed, which includes the Schottky electrode 6 having a comparatively high resistivity and a metal layer 9 formed thereon. The metal layer 9 is made of three layered metals, i.e., metals having a resistivity lower than the Schottky electrode 6 such as titanium (Ti), Pt, and Au. With this construction, the gate resistance in the direction vertical to the cross section shown in FIG. 11 can be reduced. With this structure, also, mutual diffusion is prevented during heat treatment after the formation of the Schottky electrode 6, and thus low resistance is realized while obtaining good Schottky characteristics. In this illustrated example, Ti, Pt, and Au were used as metals formed on the Schottky electrode 6. Alternatively, chromium (Cr) may be used in place of Ti, and Copper (Cu) in place of Au. Otherwise, any other low-resistance metals may be used.

Embodiment 2

A semiconductor device of EMBODIMENT 2 of the present invention will be described with reference to FIGS. 12 through 17.

Figure 12:
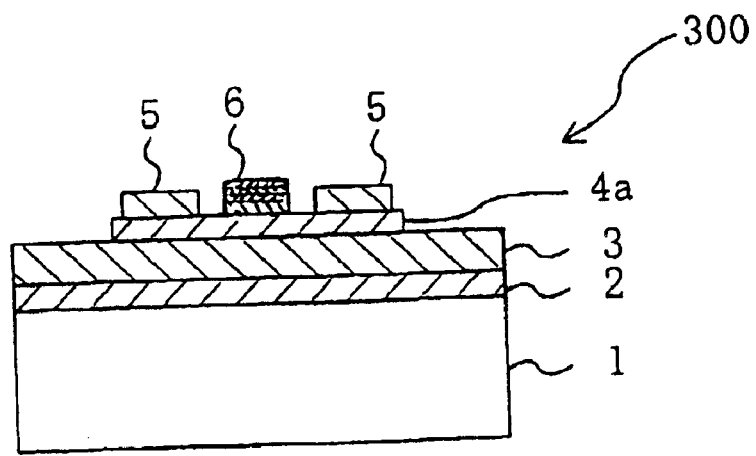
FIG. 12 is a cross-sectional view schematically illustrating a semiconductor device (HFET) of EMBODIMENT 2 of the present invention.

FIG. 12 schematically illustrates a cross section of a semiconductor device 300 of this embodiment. The semiconductor device 300 is a heterostructure field effect transistor (HFET) including a buffer layer 2, a non-doped GaN layer 3, an n-type AlGaN active layer 4a doped with Si at a carrier density of $7 \times 10^{17}$ cm$^{-3}$, and two ohmic electrodes 5 sequentially formed in this order on a sapphire substrate 1. Between the ohmic electrodes 5, formed is a Schottky electrode 6 of a layered structure composed of a Pd layer having a thickness of 200 nm and a Si layer having a thickness of 10 nm (both not shown). The bottom layer of the multilayer Schottky electrode 6 in contact with the n-type AlGaN active layer 4a should be the Si layer.

Figure 13A:
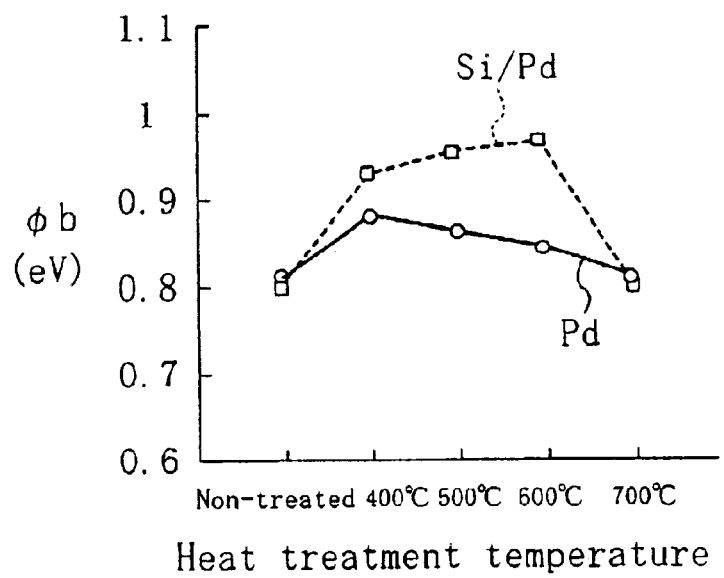
FIGS. 13A and 13B are graphs showing the barrier height and the ideal factor n value, respectively, with respect to the heat treatment temperature.
Figure 13B:
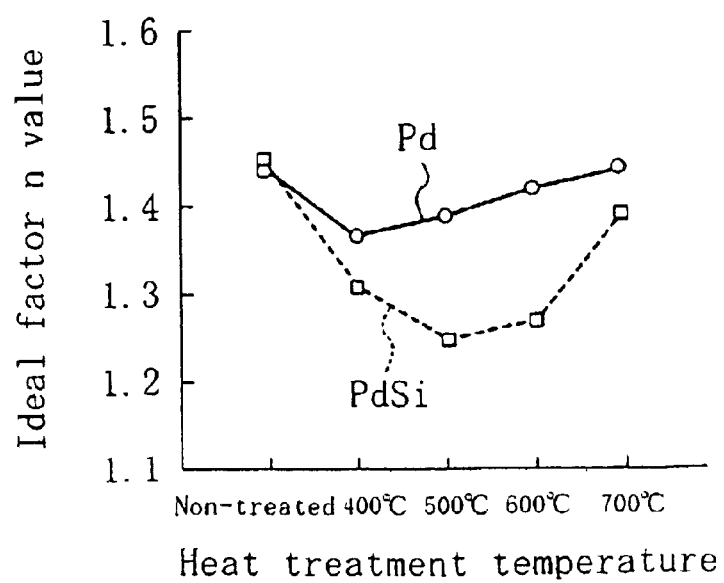

According to the construction of this embodiment where the Schottky electrode 6 is made of the Si and Pd multilayer film with the bottom layer of the multilayer film being the Si layer, the trouble of peeling of the electrode during the formation of the Schottky electrode 6 by the lift-off technique is reduced, and thus the processing yield is improved, compared with the conventional case of using Pd for the Schottky electrode 6. This is because Si is good in adhesion to the underlying n-type AlGaN layer 4a, compared with Pd. In addition, the Schottky characteristics can be improved by heat treatment performed after the formation of the Schottky electrode 6. The Schottky electrode 6 made of the multilayer structure in this embodiment is also applicable to the FETs 100 and 200 of EMBODIMENT 1. In reverse, the Schottky electrodes 6 in EMBODIMENT 1 are applicable to HFETs. FIGS. 13A and 13B show dependencies of the barrier height and the ideal factor n value, respectively, on the heat treatment temperature, calculated from the forward I-V characteristics of a Schottky diode having an area of 100 $\mu$m$^2$ fabricated under the same conditions as those for the fabrication of the HFET 300. The heat treatment was performed in an argon gas atmosphere for five minutes. FIGS. 13A and 13B also show the results of the conventional Schottky electrode made of Pd under the same conditions as those in this embodiment.

The barrier height and the ideal factor n value before heat treatment are 0.80 eV and 1.42, respectively, in the case of using the Si/Pd multilayer film, while they are 0.81 eV and 1.44 in the case of using Pd. When no heat treatment is performed, the Schottky characteristics are roughly the same in the two cases.

When heat treatment is performed at 400° C., the barrier height and the ideal factor n value are 0.93 eV and 1.30, respectively, in the case of using the Si/Pd multilayer film, while they are 0.88 eV and 1.36 in the case of using Pd. This indicates that both the barrier height and the ideal factor n value are improved by the 400° C. heat treatment in both cases. This improvement is greater in the case of using the Si/Pd multilayer film of the present invention.

When heat treatment is performed at 500° C., the barrier height and the ideal factor n value are 0.95 eV and 1.24, respectively, in the case of using the Si/Pd multilayer film, showing improvement. On the contrary, they are 0.86 eV and 1.38 in the case of using Pd, showing degradation.

When heat treatment is performed at 600° C., the barrier height and the ideal factor n value are 0.96 eV and 1.26, respectively, in the case of using the Si/Pd multilayer film, showing substantially no change from those at 500° C. On the contrary, they are 0.84 eV and 1.41 in the case of using Pd, showing further degradation.

When the temperature of heat treatment is raised to 700° C., the barrier height and the ideal factor n value show only small improvement even in the case of using the Si/Pd multilayer film.

From the above results, it is found that the Schottky characteristics are markedly improved by using the Si/Pd multilayer film, in place of the conventional Pd, for the Schottky electrode 6 and heat-treating the Schottky electrode 6 at a temperature in the range of 400 to 600° C., desirably in the range of 500 to 600° C.

Figure 14A:
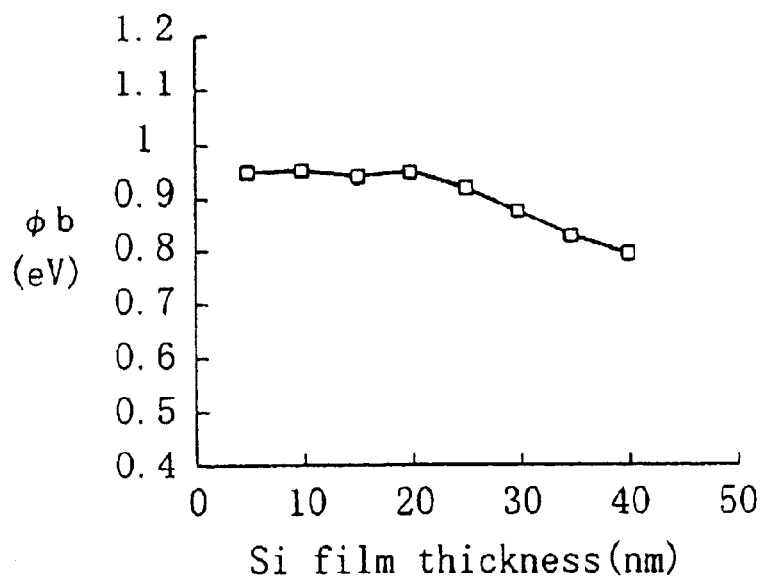
FIGS. 14A and 14B are graphs showing the barrier height and the ideal factor n value, respectively, with respect to the Si film thickness (nm).
Figure 14B:
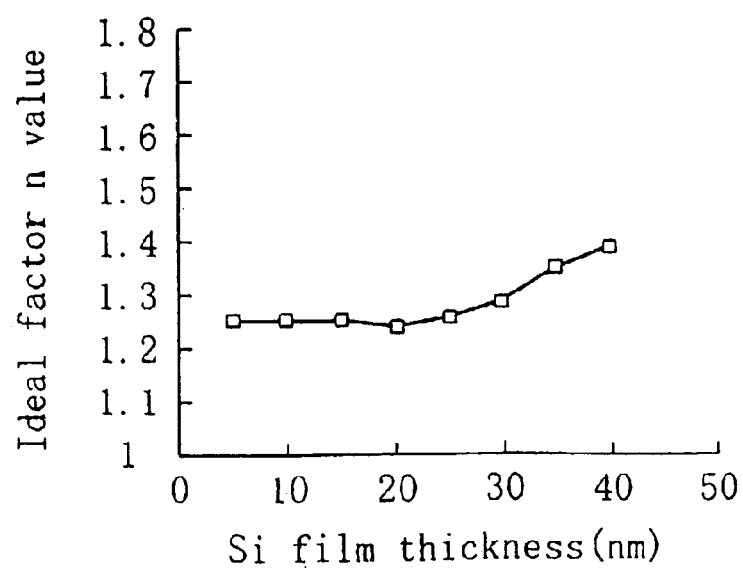

FIG. 14A shows the evaluation results of the relationship between the thickness of the Si layer of the Si/Pd multilayer film and the barrier height as one of the Schottky characteristics, and FIG. 14B shows the evaluation results of the relationship between the thickness of the Si layer of the Si/Pd multilayer film and the ideal factor n value. The Schottky electrode 6 evaluated had an area of 100 $\mu$m$^2$ and, after formation, was subjected to five-minute heat treatment at 500° C. In this embodiment, the evaluation was made for the Si layers having a thickness of 5 nm, 10 nm, 15 nm, 20 nm, 25 nm, 30 nm, 35 nm, and 40 nm.

As is observed from FIGS. 14A and 14B, both the barrier height and the ideal factor n value are roughly stable when the thickness of the Si layer is 20 nm or less. When the thickness exceeds 25 nm, the barrier height gradually decreases. This is presumably because, while Pd inherently has a high work function for a GaN compound semiconductor, Si has a work function lower than Pd, and as the thickness of the Si layer increases in the Si/Pd multilayer film, the contribution of Pd to Schottky junction decreases. In consideration of the above, in order to obtain a Schottky electrode having good Schottky characteristics, the thickness of the Si layer is desirably 20 nm or less. As for the adhesion of the Schottky electrode, no degradation was observed as the thickness of the Si layer increased. This is due to the fact that the adhesion of the Si/Pd multilayer film is determined by the existence of Si.

In view of the above, the thickness of the Si layer is desirably in the range between more than 0 nm (e.g., 5 nm or more) and 20 nm or less.

In this embodiment, the case of using the Si/Pd multilayer film as the Schottky electrode 6 was described in comparison with the case of using Pd. The same results are also obtained when a Pd and Ni multilayer film is used.

Figure 15A:
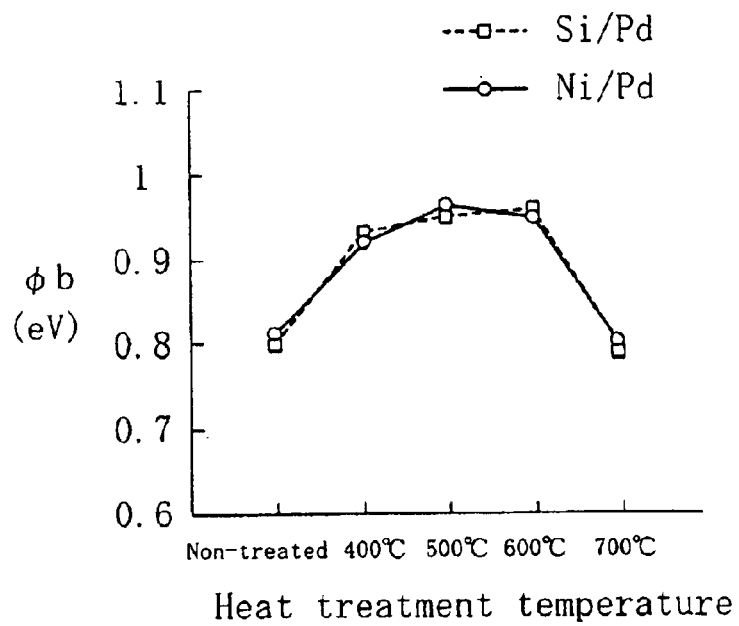
FIGS. 15A and 15B are graphs showing the barrier height and the ideal factor n value, respectively, with respect to the heat treatment temperature.
Figure 15B:
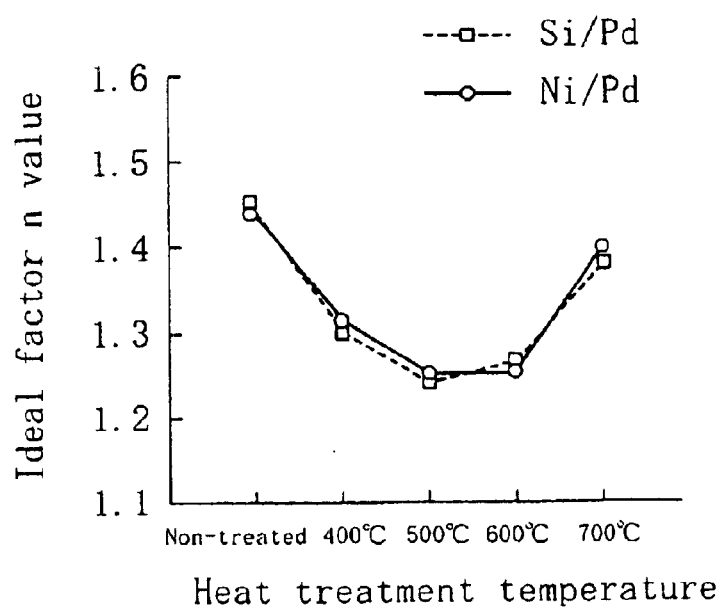

FIG. 15A shows the relationship between the barrier height and the heat treatment temperature, and FIG. 15B shows the relationship between the ideal factor n value and the heat treatment temperature, both in the cases of using the Si/Pd multilayer film and the Ni/Pd multilayer film for the Schottky electrode 6. The two curves in each of FIGS. 15A and 15B are roughly the same although actual values of the barrier height and the ideal factor n value for the respective heat treatment temperatures are slightly different from each other. These differences in values are within allowable measurement errors, and thus it is found that the Ni/Pd multilayer film also provides a good Schottky electrode 6 for the GaN compound semiconductor. The adhesion was also evaluated and found that the Ni/Pd multilayer film exhibited good adhesion with little causing processing failure such as peeling.

Platinum (Pt) is also a material often used as a Schottky electrode 6 in combination with a GaN compound semiconductor. As in the case of Pd, Pt is poor in adhesion to GaN. Therefore, when the Schottky electrode 6 is formed using Pt by the lift-off technique, the processing yield is significantly low. In order to solve this problem, use of a multilayer film of Pt with Si or Ni was examined as in the case of Pd.

Figure 16A:
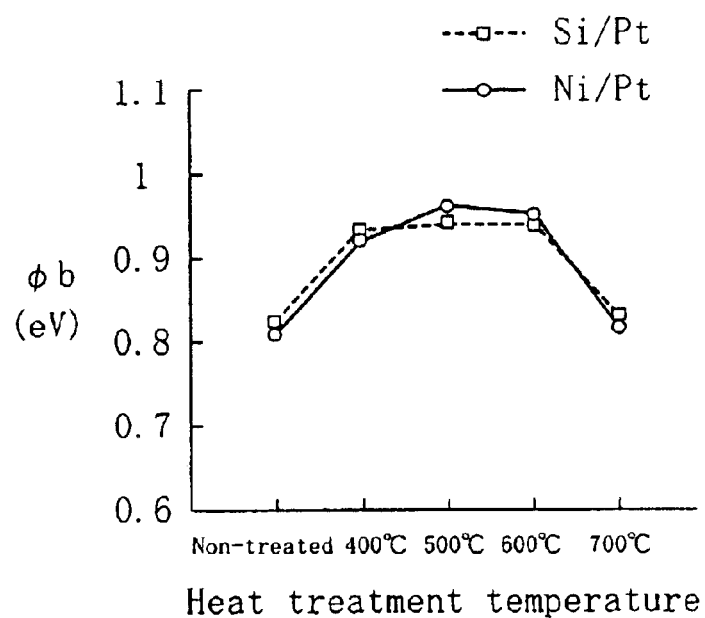
FIGS. 16A and 16B are graphs showing the barrier height and the ideal factor n value, respectively, with respect to the heat treatment temperature.
Figure 16B:
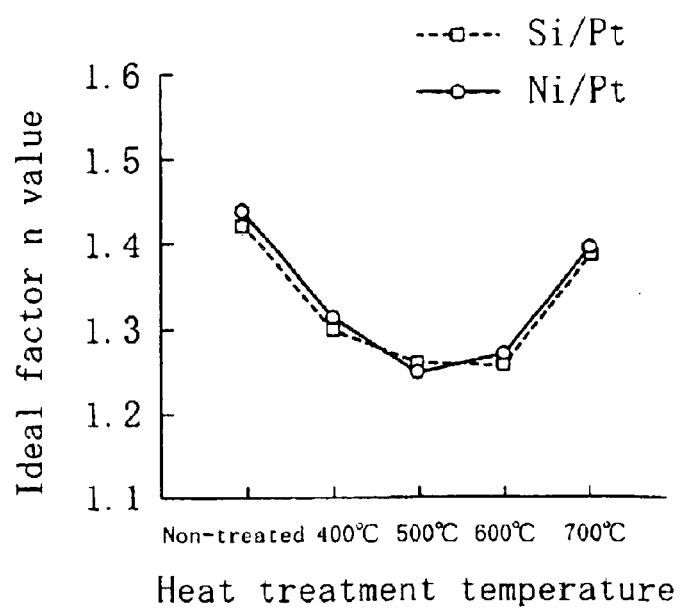

FIG. 16A shows the relationship between the barrier height and the heat treatment temperature, and FIG. 16B shows the relationship between the ideal factor n value and the heat treatment temperature, both in the cases of using a Si/Pt multilayer film and a Ni/Pt multilayer film for the Schottky electrode 6. In this case, also, the barrier height and the ideal factor n value are improved by the heat treatment at a temperature in the range of 400 to 600° C. as in the case of using Pd. The adhesion of the Schottky electrode 6 is improved by using the multilayer film of Pt with Si or Ni as in the case of Pd, and thus the yield improves. In view of the above results, it is found that the Si/Pt multilayer film and the Ni/Pt multilayer film are also highly effective as the Schottky electrode 6.

Figure 17:
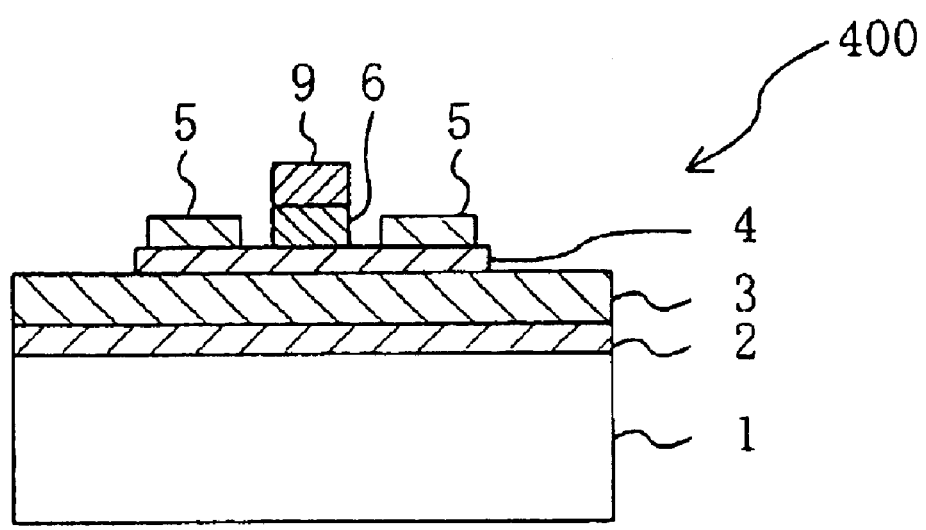
FIG. 17 is a cross-sectional view schematically illustrating another semiconductor device (HFET) of EMBODIMENT 2.

The Si/Pd, Ni/Pd, Si/Pt, and Ni/Pt multilayer films are not low in resistivity. Therefore, when any of these films is to be used as the gate electrode (Schottky electrode 6) of a high-frequency device, the gate resistance in the direction vertical to the cross section shown in FIG. 12. In order to overcome the above problem, a semiconductor device 400 shown in FIG. 17 is proposed, which includes the Schottky electrode 6 made of a multilayer film and a metal layer 9 formed thereon. The metal layer 9 is made of three layered metals, i.e., metal having a resistivity lower than the Schottky electrode 6 such as titanium (Ti), Pt, and Au. With this construction, the gate resistance in the direction vertical to the cross section shown in FIG. 17 can be reduced.

With the above construction, also, mutual diffusion is prevented during heat treatment after formation of the Schottky electrode 6, and thus low resistance is realized while obtaining good Schottky characteristics. In this embodiment, Ti, Pt, and Au were used as metals having a resistivity lower than the Schottky electrode 6. Alternatively, chromium (Cr) may be used in place of Ti, and Copper (Cu) in place of Au. Otherwise, any other low-resistance metals may be used.

Embodiment 3

A semiconductor device of EMBODIMENT 3 of the present invention will be described with reference to FIGS. 18A through 18D and 19. FIGS. 18A through 18D illustrate steps for fabrication of a field effect transistor (FET) 500 of EMBODIMENT 3.

Figure 18A:
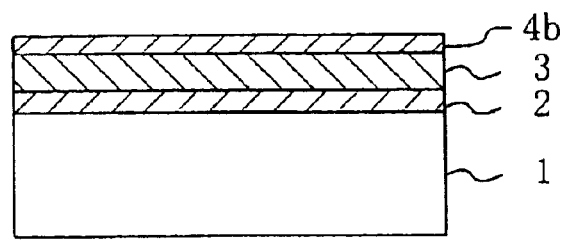
FIGS. 18A through 18D are cross-sectional views illustrating the steps of fabrication of a semiconductor device (FET) of EMBODIMENT 3 of the present invention.

Referring to FIG. 18A, a buffer layer 2 made of AlN and then a non-doped GaN layer 3 are deposited on a sapphire substrate 1 in this order to thicknesses of about 40 nm and about 2 µm, respectively, by MOCVD. Then, a Si-doped n-type GaN layer 4b having a carrier density of $7 \times 10^{17}$ cm$^{-3}$ is deposited on the GaN layer 3 to a thickness of 100 nm.

Figure 18B:
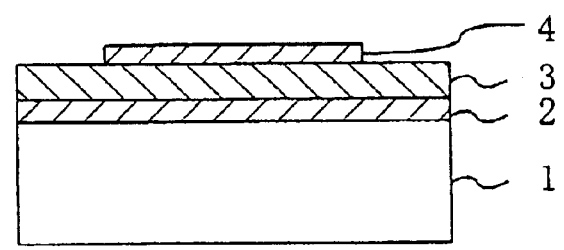

Referring to FIG. 18B, the n-type GaN layer 4b is removed by mesa-etching, leaving only a FET formation region unremoved to form an n-type GaN active layer 4.

Figure 18C:
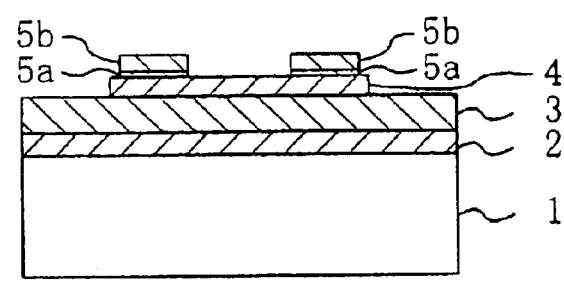

Referring to FIG. 18C, a Ti layer 5a and then an Al layer 5b are deposited on the n-type GaN active layer 4 to thicknesses of 20 nm and 200 nm, respectively, for use as metals for ohmic electrodes. The layers 5a and 5b are subjected to the lift-off procedures and then one-minute annealing at 600° C., to obtain ohmic electrodes 5 as shown in FIG. 18D.

Finally, a PdSi alloy layer containing 10% by weight of Si as the Schottky metal, a Ti layer, a Pt layer, and an Au layer (all not shown) are sequentially deposited in this order to thicknesses of 50 nm, 50 nm, 50 nm, and 200 nm, respectively. These metal layers are subjected to the lift-off procedures and then five-minute heat treatment at 500° C., to form a Schottky electrode 6 and a metal layer 9. Thus, the FET 500 (FIG. 18D) of this embodiment is completed.

Figure 18D:
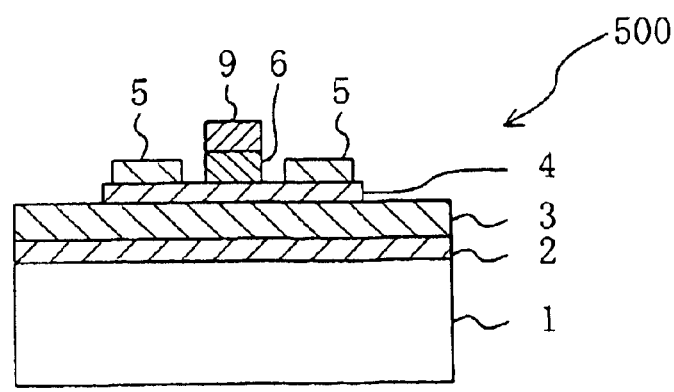
Figure 19:
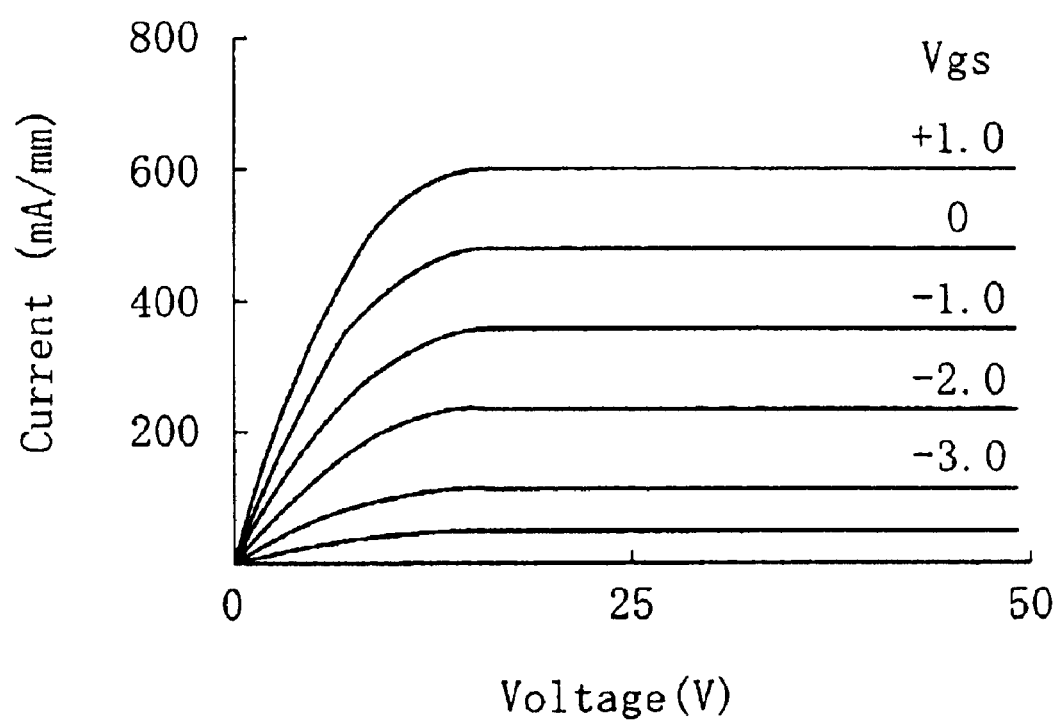
FIG. 19 is a graph showing the static characteristics after heat treatment of the semiconductor device of EMBODIMENT 3.

FIG. 19 shows the static characteristics of the FET 500 shown in FIG. 18D. As is seen from this graph, the drain current increases even when an applied gate voltage is +1.0 V since the barrier height is large. The FET 500 therefore has a high current drive ability. In addition, good FET characteristics are obtained even when the drain voltage is 50 V since the inverse breakdown voltage at the Schottky junction is high. In this embodiment, the processing yield of the Schottky electrode 6 was roughly 100%, indicating that there occurred no processing failure such as peeling of the Schottky electrode 6.

In this embodiment, PdSi was used as the material for the Schottky electrode 6. Alternatively, PdNi, PtSi, and PtNi may also be used. In this embodiment, Ti, Pt, and Au that were low-resistance metals were deposited on the PdSi Schottky electrode 6 for reducing the gate resistance. Alternatively, other metals such as Cr and Cu may also be used as long as the metal does not easily cause a structural change such as mutual diffusion during heat treatment after the formation of the Schottky electrode 6.

The PdSi alloy used as the Schottky metal contained Si in an amount of 10% by weight. The Si weight content is not limited to this value but may be any percentage as long as good Schottky characteristics and high adhesion are obtained. As shown in FIGS. 6A and 6B, good Schottky characteristics are obtainable if the Si weight content in PdSi is 20% or less. Also found as a result of an experiment on PtSi has been that good Schottky characteristics are obtainable if the Si weight content in PtSi is 20% or less. Similar results have also been obtained for PdNi and PtNi.

Embodiment 4

A semiconductor device of EMBODIMENT 4 of the present invention will be described with reference to FIGS. 20A through 20D and 21. FIGS. 20A through 20D illustrate steps for fabrication of a heterostructure field effect transistor (HFET) 600 of EMBODIMENT 4.

Figure 20A:
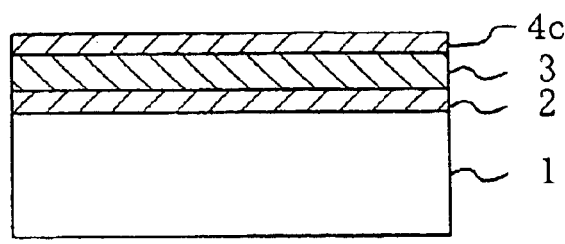
FIGS. 20A through 20D are cross-sectional views illustrating the steps of fabrication of a semiconductor device (HFET) of EMBODIMENT 4 of the present invention.

Referring to FIG. 20A, a buffer layer 2 made of AlN and then a non-doped GaN layer 3 are deposited on a sapphire substrate 1 in this order to thicknesses of about 20 nm and about 2 µm, respectively, by MOCVD. A Si-doped n-type AlGaN layer 4c having a carrier density of $7 \times 10^{17}$ cm$^{-3}$ is then deposited on the GaN layer 3 to a thickness of 100 nm.

Figure 20B:
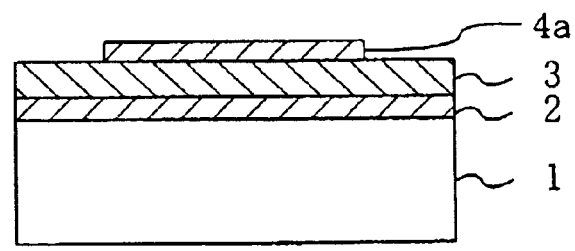

Referring to FIG. 20B, the n-type AlGaN layer 4c is removed by mesa-etching, leaving only a FET formation region unremoved to form an n-type AlGaN active layer 4a.

Figure 20C:
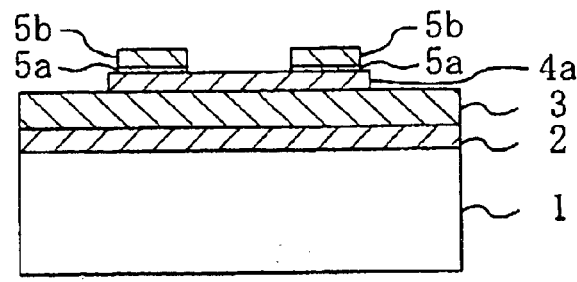
Figure 20D:
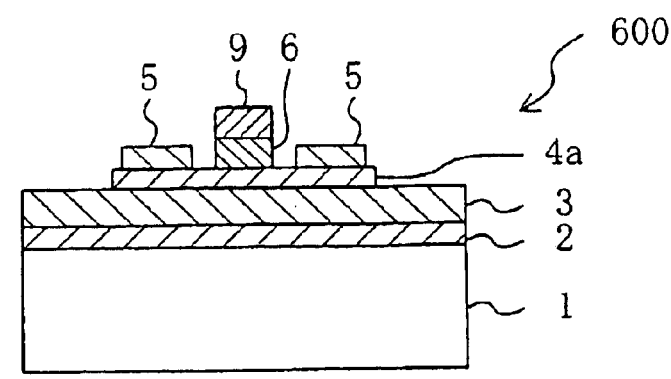

Referring to FIG. 20C, a Ti layer 5a and then an Al layer 5b are sequentially deposited on the n-type AlGaN active layer 4a to thicknesses of 20 nm and 200 nm, respectively, for use as metals for ohmic electrodes. The layers 5a and 5b are then subjected to the lift-off procedures and then one-minute annealing at 600° C., to obtain ohmic electrodes 5 as shown in FIG. 20D.

Finally, as the Schottky metal, a Si layer and a Pd layer (both not shown) are sequentially deposited to thicknesses of 10 nm and 150 nm, respectively. Subsequently, for reduction in gate resistance, a Ti layer, a Pt layer, and an Au layer (all not shown) are sequentially deposited in this order to thicknesses of 50 nm, 50 nm, and 200 nm, respectively. These metal layers are subjected to the lift-off procedures and then five-minute heat treatment at 500° C., to form a Schottky electrode 6 and a metal layer 9. Thus, the HFET 600 of this embodiment is completed.

Figure 21:
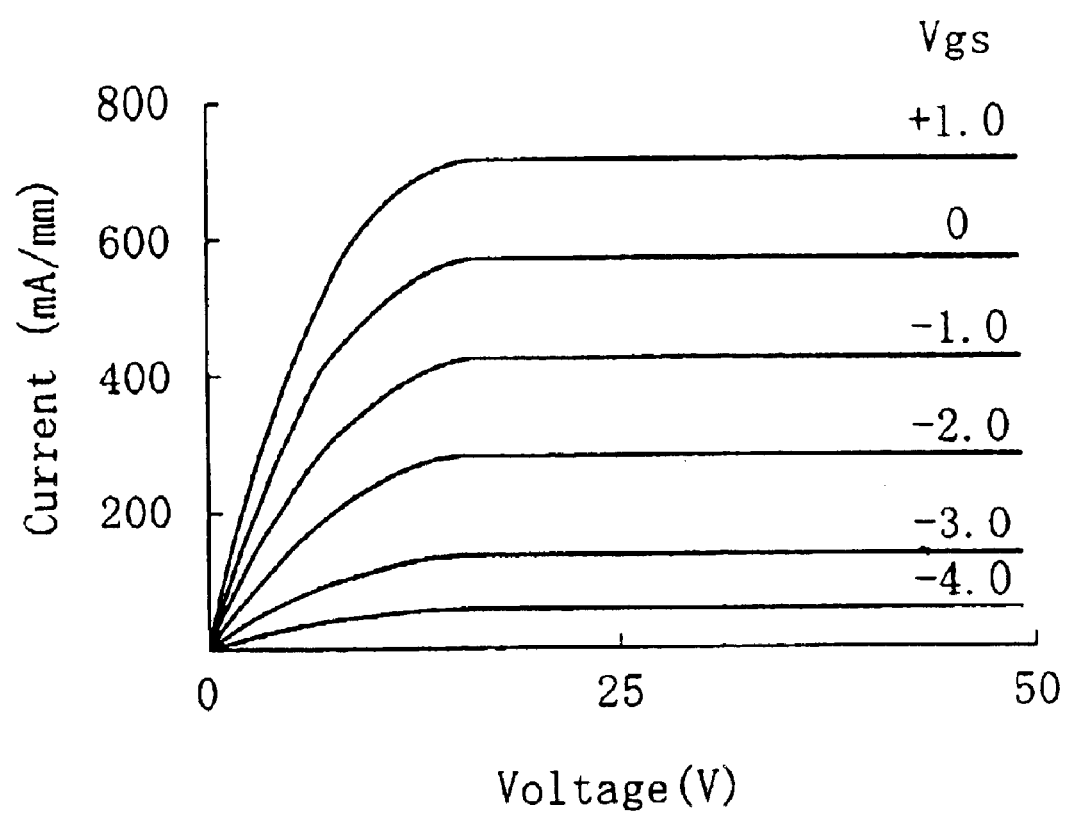
FIG. 21 is a graph showing the static characteristics after heat treatment of the semiconductor device of EMBODIMENT 4.

FIG. 21 shows the static characteristics of the HFET 600 after heat treatment. As is seen from this graph, no gate leak occurs even when an applied gate voltage is +1.0 V due to the barrier height of the HFET 600. The HFET 600 therefore has a high current drive ability. In addition, good HFET characteristics are obtained even when the drain voltage is 50 V since the inverse breakdown voltage at the Schottky junction is high. In this embodiment, the processing yield of the Schottky electrode 6 was roughly 100%, indicating that there occurred no processing failure such as peeling of the Schottky electrode 6.

In this embodiment, the Si/Pd multilayer film was used as the material for the Schottky electrode 6. Alternatively, a Ni/Pd multilayer film, a Si/Pt multilayer film, and a Ni/Pt multilayer film may also be used. In this embodiment, Ti, Pt, and Au that were low-resistance metals were deposited on the Si/Pd multilayer film for reducing the gate resistance. Alternatively, other metals such as Cr and Cu may also be used as long as the metal does not easily cause a structural change such as mutual diffusion during heat treatment after the formation of the Schottky electrode 6.

In this embodiment, the thickness of the Si layer as the bottom layer of the Si/Pd multilayer film used as the Schottky metal was 10 nm. Alternatively, any other thickness of the Si layer may be adopted as long as good Schottky characteristics and good adhesion are obtained. As shown in FIGS. 14A and 14B, good Schottky characteristics are obtainable if the thickness of the Si layer is 20 nm or less. Also found as a result of an experiment on a Si/Pt multilayer film has been that good Schottky characteristics are obtainable if the thickness of the Si layer is 20 nm or less. Similar results have also been obtained for a Ni/Pd multilayer film and a Ni/Pt multilayer film.

In the above embodiments of the present invention, the fabrication processes for FETs and HFETs were described. The present invention is also applicable to any other devices that include a gallium nitride (GaN) compound semiconductor and have a Schottky electrode.

According to the present invention, a Schottky electrode formed on a GaN compound semiconductor layer contains silicon or nickel, which provides excellent adhesion to the GaN compound semiconductor layer. This makes it possible to provide a semiconductor device including a Schottky electrode excellent in adhesion. As a result, by using such a Schottky electrode, it is possible to improve the yield of a GaN compound semiconductor device having excellent high-frequency characteristics and power characteristics.

Good Schottky characteristics are obtainable when the weight content of silicon in the Schottky electrode is in the range between more than 0% and 20% or less. The Schottky characteristics can further be enhanced when the Schottky electrode is heat-treated at a temperature in the range of 400 to 600° C.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for fabricating a semiconductor device, comprising the steps of:

preparing a gallium nitride compound semiconductor layer;

forming a Schottky electrode containing silicon and palladium on the gallium nitride compound semiconductor layer;

after the step of forming a Schottky electrode, heat-treating the Schottky electrode at a temperature in a range between 400° C. and 600° C.

2. A method according to claim 1, wherein the step of heat-treating the Schottky electrode is performed at a temperature in a range between 500° C. and 600° C.

3. A method for fabricating a semiconductor device, comprising the steps of:

preparing a gallium nitride compound semiconductor layer;

forming a Schottky electrode having a multilayer structure the bottom layer of which is made of silicon and palladium; and after the step of forming a Schottky electrode, heat-treating the Schottky electrode at a temperature in a range between 400° C. and 600° C.

4. A method according to claim 3, wherein the step of heat-treating the Schottky electrode is performed at a temperature in a range between 500° C. and 600° C.

* * * * *